(12) United States Patent
Chung et al.

(10) Patent No.: US 6,849,517 B2
(45) Date of Patent: Feb. 1, 2005

(54) METHODS OF FORMING CAPACITORS INCLUDING REDUCING EXPOSED ELECTRODES IN SEMICONDUCTOR DEVICES

(75) Inventors: Jung-Hee Chung, Seoul (KR); Young-Sun Kim, Gyeonggi-do (KR); Han-Mei Choi, Seoul (KR); Yun-Jung Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/386,640

(22) Filed: Mar. 12, 2003

(65) Prior Publication Data

US 2004/0018678 A1 Jan. 29, 2004

(30) Foreign Application Priority Data

Mar. 14, 2002 (KR) .............................. 10-2002-0013720

(51) Int. Cl.[7] .............................................. H01L 21/20
(52) U.S. Cl. ...................... 438/396; 438/240; 438/238; 438/241; 438/381; 438/3; 438/776; 438/393
(58) Field of Search ................................ 438/396, 240, 438/238, 241, 381, 778, 393, 3

(56) References Cited

U.S. PATENT DOCUMENTS

| 5,943,568 A | 8/1999 | Fujii et al. ................. 438/240 |
| 6,136,641 A * | 10/2000 | Won et al. ................. 438/240 |
| 6,376,259 B1 * | 4/2002 | Chu et al. ..................... 438/3 |
| 6,534,326 B1 * | 3/2003 | Hsu et al. ..................... 438/3 |
| 6,649,464 B2 * | 11/2003 | Lee ............................. 438/238 |
| 2002/0024074 A1 * | 2/2002 | Jung et al. ................. 257/295 |
| 2002/0070404 A1 * | 6/2002 | Bruchhaus et al. ......... 257/310 |
| 2003/0007319 A1 * | 1/2003 | Zhang et al. .............. 361/523 |
| 2003/0102531 A1 * | 6/2003 | Joshi et al. ................ 257/629 |
| 2003/0148579 A1 * | 8/2003 | Hikosaka et al. .......... 438/241 |
| 2003/0173613 A1 * | 9/2003 | Sheu et al. ................ 257/306 |

FOREIGN PATENT DOCUMENTS

KR  1995-16611  1/2000

* cited by examiner

Primary Examiner—Matthew Smith
Assistant Examiner—Victor Yevsikov
(74) Attorney, Agent, or Firm—Myers Bigel Sibley & Sajovec, P.A.

(57) ABSTRACT

A method of fabricating an integrated circuit device having capacitors is provided. The capacitors can include a first electrode, a dielectric layer and a second electrode. An interlayer insulating layer is formed on the capacitor. The interlayer insulating layer is patterned to form a metal contact hole that exposes a region of the second electrode. The exposed region of the second electrode is reduced to remove excessive oxygen atoms that can exist in the second electrode.

29 Claims, 6 Drawing Sheets

METHODS OF FORMING CAPACITORS INCLUDING REDUCING EXPOSED ELECTRODES IN SEMICONDUCTOR DEVICES

RELATED APPLICATION

This application claims the benefit of Korean Patent Application No. 2002-0013720, filed Mar. 14, 2002, the contents of which are herein incorporated by reference in its entirety the disclosure of which is hereby incorporated herein by reference.

FIELD OF THE INVENTION

The present invention relates to methods of forming semiconductor device in general, and specifically, to methods of forming capacitors in semiconductor devices.

BACKGROUND

Dynamic random access memory (DRAM) devices can employ cell capacitors to store data. Attempts to increase the density of DRAM devices have typically resulted in the decrease of the area that the cell capacitors occupy. As a result, the capacitance of the cells may be reduced in proportion to the respective cell area. If cell capacitance is reduced too much, data stored in the cells may be lost due to alpha particles. Accordingly, the cell capacitance should be maintained to guard against the potential loss of data and to generally improve the characteristics of the cells in such highly integrated DRAMs. It is known to use dielectric layers having a high dielectric constant in DRAM devices to increase the cell capacitance.

FIGS. 1 through 3 are cross-sectional views that illustrate a method of fabricating a conventional semiconductor device. Referring to FIG. 1, a lower interlayer insulating layer 3 is formed on a semiconductor substrate 1. A bottom electrode contact plug 5 is formed in the lower interlayer insulating layer 3 and penetrates a predetermined region of the lower interlayer insulating layer 3. A bottom electrode 7 is formed on the lower interlayer insulating layer 3 to cover the bottom electrode contact plug 5. A dielectric layer 9 is formed on an entire surface of the semiconductor substrate 1 having the bottom electrode 7. The dielectric layer 9 is formed of a tantalum oxide layer ($Ta_2O_5$) having a dielectric constant that is greater than that of a silicon nitride layer. The substrate and the dielectric layer 9 is then annealed to crystallize the dielectric layer 9. As a result, the dielectric layer 9, (i.e., the tantalum oxide layer) has a high dielectric constant of about 20 to 30.

Referring to FIG. 2, a top electrode 11 is formed on the annealed dielectric layer 9. The top electrode 11 is formed of a conductive layer that has strong oxidation resistance. For example, the top electrode 11 may be formed of a platinum layer or a ruthenium layer. The substrate including the top electrode 11 is annealed in an oxygen atmosphere to remove or reduce oxygen vacancies from the dielectric layer 9. During this annealing process, oxygen atoms may penetrate the top electrode 11 (from the dielectric layer 9) thereby increasing the quantity of oxygen atoms in the top electrode 11. An upper interlayer insulating layer 13 is formed on the top electrode 11 after the oxygen annealing process.

Referring to FIG. 3, the upper interlayer insulating layer 13 is patterned to form a metal contact hole 15 that exposes a predetermined region of the top electrode 11. An ohmic metal layer 17 and a barrier metal layer 19 are sequentially formed on an entire surface of the substrate including the metal contact hole 15. A titanium layer is widely used as the ohmic metal layer 17. The titanium atoms in the ohmic metal layer 17 may react with the oxygen atoms in the top electrode 11, thereby generating an insulating layer, such as a titanium oxide layer 21, at an interface between the ohmic metal layer 17 and the top electrode layer 11 which may increase the contact resistance between the ohmic metal layer 17 and the top electrode layer 11.

SUMMARY

Embodiments according to the present invention can provide integrated circuits including capacitors having a first electrode, a dielectric layer and a second electrode on substrate. An interlayer insulating layer is formed on the substrate and is patterned to form a metal contact hole that exposes a region of the second electrode. The exposed region of the second electrode is reduced which can decrease an amount of oxygen in the second electrode, thereby allowing a reduction in contact resistance associated with the second electrode.

In some embodiments according to the present invention, reducing the exposed region of the second electrode includes reducing the exposed region of the second electrode in a hydrogen gas atmosphere at a temperature in a range between about 200 degrees Centigrade (° C.) and about 500° C. In some embodiments according to the present invention, reducing the exposed region of the second electrode includes reducing the exposed region of the second electrode in a hydrogen plasma atmosphere at a temperature in a range between about 200° C. to about 700° C.

A wet cleaning process may be additionally carried out before or after the reduction of the exposed region of the second electrode. The wet cleaning process can be performed to remove polymers and/or native oxide that exist in the metal contact hole. In addition, a metal layer can be formed on an entire surface of the substrate where the reducing process is finished, and the metal layer can be patterned to form an interconnection line. The metal layer may be formed from an ohmic metal layer, a barrier metal layer and an interconnection metal layer.

Furthermore, a capping layer may be formed on the second electrode prior to formation of the interlayer insulating layer. The capping layer can be formed to increase adhesive strength between the second electrode and the interlayer insulating layer.

DETAILED DESCRIPTION OF THE INVENTION

Figure 1:
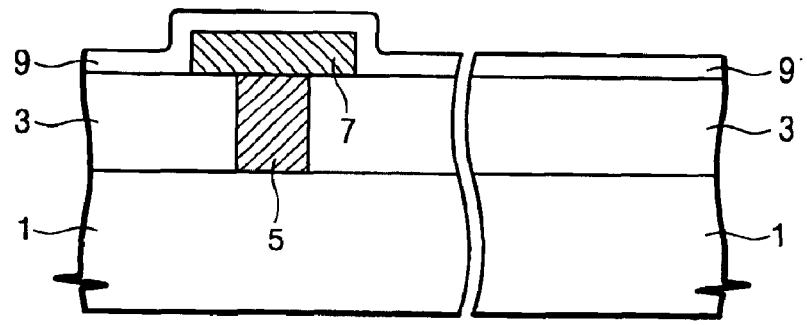
FIGS. 1 to 3 are cross-sectional views illustrating a conventional method of forming a semiconductor device.
Figure 2:
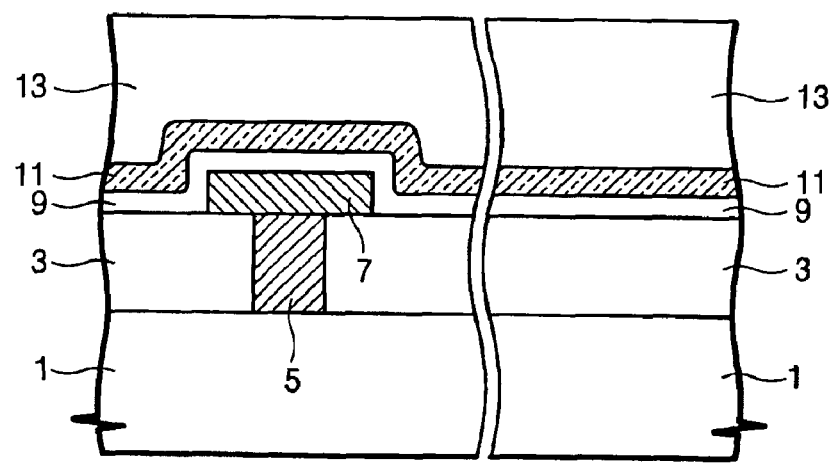
Figure 3:
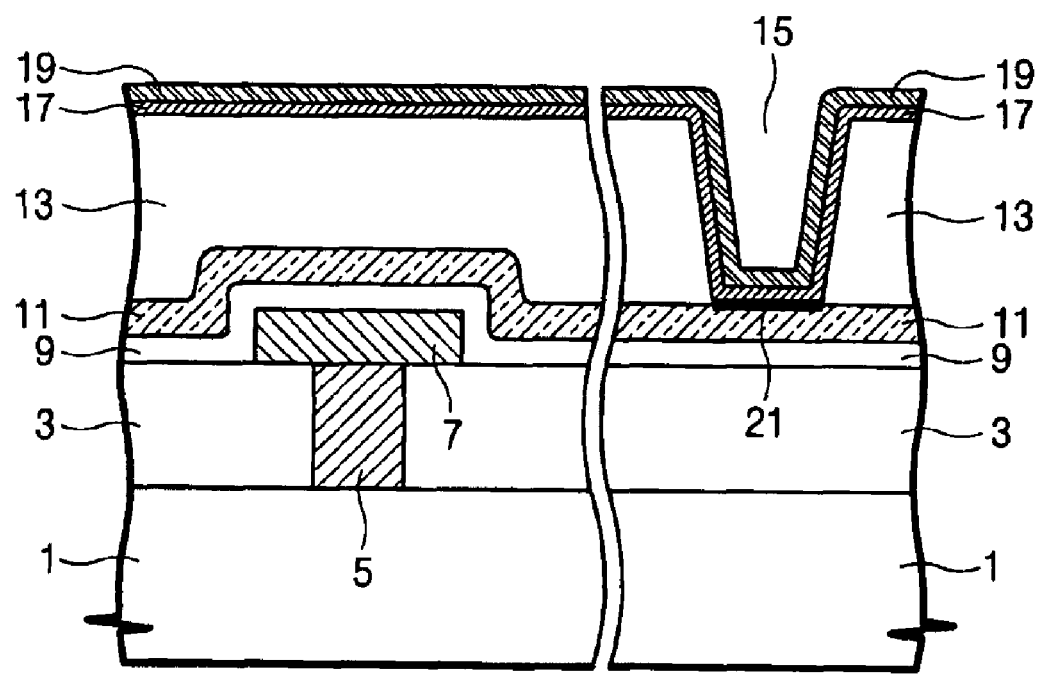

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

Figure 4:
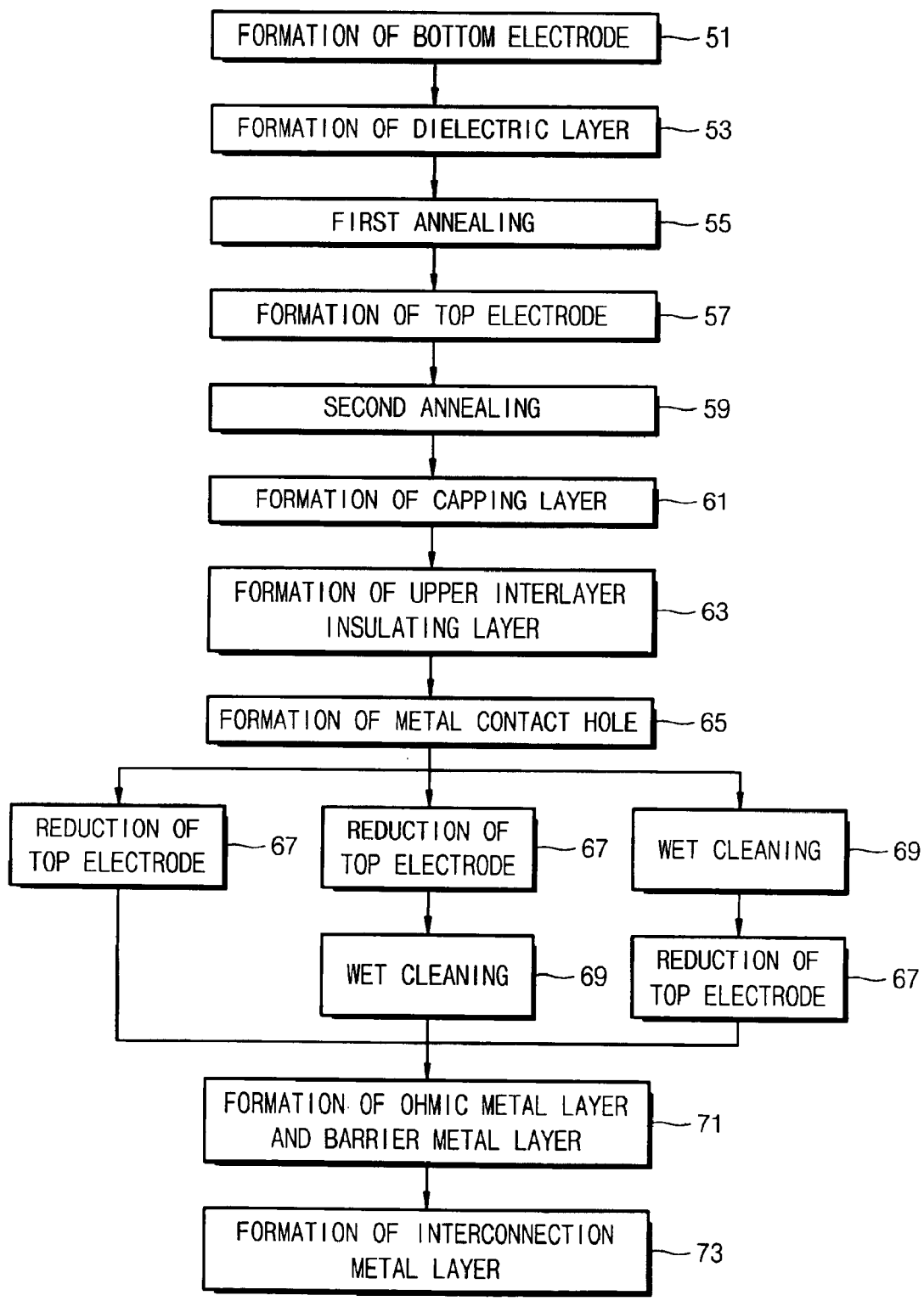
FIG. 4 is a flowchart illustrating methods of forming integrated circuit device embodiments according to the present invention.

FIG. 4 is a flow chart illustrating methods of forming integrated circuit device embodiments according to the present invention. FIGS. 5 to 9 are cross-sectional views illustrating devices and methods of forming integrated circuit device embodiments according to embodiment of the present invention.

Figure 5:
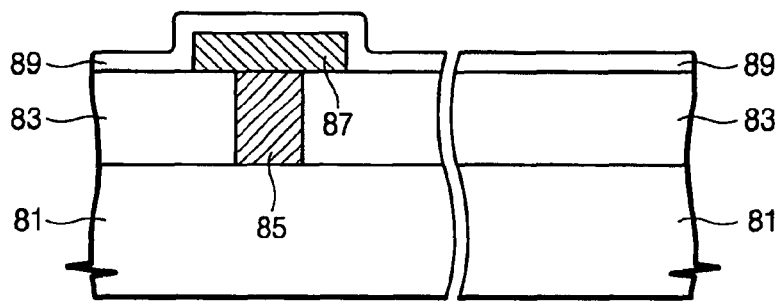
FIGS. 5 to 9 are cross-sectional views illustrating devices and methods of forming integrated circuit device embodiments according to the present invention.

Referring to FIGS. 4 and 5, a lower interlayer insulating layer 83 is formed on a semiconductor substrate 81. It will be understood that the substrate can be any type of material suitable for the fabrication of integrated circuit devices. The lower interlayer insulating layer 83 is patterned to form a bottom electrode contact hole that exposes a predetermined region of the semiconductor substrate 81. A conductive layer, such as a doped silicon layer, is formed on the surface of the substrate 81 including the bottom electrode contact hole. The conductive layer is etched back until the lower interlayer insulating layer 83 is exposed, thereby forming a bottom electrode contact plug 85 in the bottom electrode contact hole.

A bottom electrode layer is formed on the bottom electrode contact plug 85. In some embodiments according to the present invention, the bottom electrode layer is a doped silicon layer, a noble metal layer or a conductive metal oxide layer or a combination of these materials. It will also be understood that other materials can be used. In some embodiments according to the present invention, the noble metal layer is a platinum layer, an iridium layer or a ruthenium layer, and the conductive metal oxide layer is an iridium oxide layer, a ruthenium oxide layer or a platinum oxide layer. It will also be understood that other materials can be used for the noble metal layer and the conductive metal oxide layer. If the bottom electrode layer is a doped silicon layer, the formation of the contact plug 85 discussed above may be omitted.

The bottom electrode layer is patterned to form a bottom electrode 87 on the bottom electrode contact plug 85 (Block 51). In some embodiments according to the present invention, bottom electrode 87 completely covers the bottom electrode contact plug 85. A dielectric layer 89 is formed on the bottom electrode 87 (Block 53). In some embodiments according to the present invention, the dielectric layer 89 is formed of a layer having a high dielectric constant, which is greater than that of a silicon oxide layer. For example, the high dielectric layer may be formed of a tantalum oxide layer (TaO), an aluminum oxide layer (AlO), a titanium oxide layer (TiO), a PLZT layer ((Pb,La)(Zr,Ti)$O_3$) or a BST layer ((Ba,Sr)$TiO_3$), a tantalum nitride layer (TaN), a titanium nitride layer (TIN) or a combination of these materials. It will also be understood that other materials can be used. The substrate, including the dielectric layer 89, is annealed to crystallize the dielectric layer 89 (Block 55). The annealed dielectric layer 89 can have a more stable crystalline structure. In other words, the annealed dielectric layer can exhibit a more uniform and greater dielectric constant. In some embodiments according to the present invention, the annealing is performed in a nitrogen gas atmosphere at a temperature of about 700 degrees Centigrade (° C.) for about 5 minutes. In other embodiments according to the present invention, the annealing is carried out in an oxygen gas atmosphere at a temperature of about 600° C. for about 30 minutes.

Figure 6:
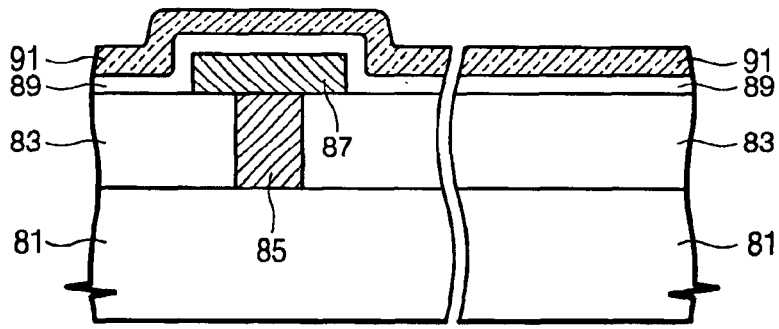

Referring to FIGS. 4 and 6, a top electrode 91 is formed on the crystallized dielectric layer 89 (Block 57). The top electrode 91 is formed of a noble metal layer or a conductive metal oxide layer. In some embodiments according to the present invention, the noble metal layer is formed of a platinum layer, an iridium layer, or a ruthenium layer, and the conductive metal oxide layer is formed of an iridium oxide layer, a ruthenium oxide layer or a platinum oxide layer or combinations of these materials. It will be further understood that the noble metal layer can be formed of other materials. The substrate, including the top electrode 91, is annealed in oxygen gas atmosphere to cure oxygen vacancy defects that can exist in the dielectric layer 89 (Block 59). The annealing process is performed at a temperature of about 400 degrees ° C. for about 30 minutes. However, a portion of the oxygen atoms may remain in the top electrode 91 during the annealing process, thereby allowing an increase in the amount of oxygen atoms present in the top electrode 91. As a result, increased amounts of oxygen atoms may remain in the top electrode 91 despite the second annealing described above.

Figure 7:
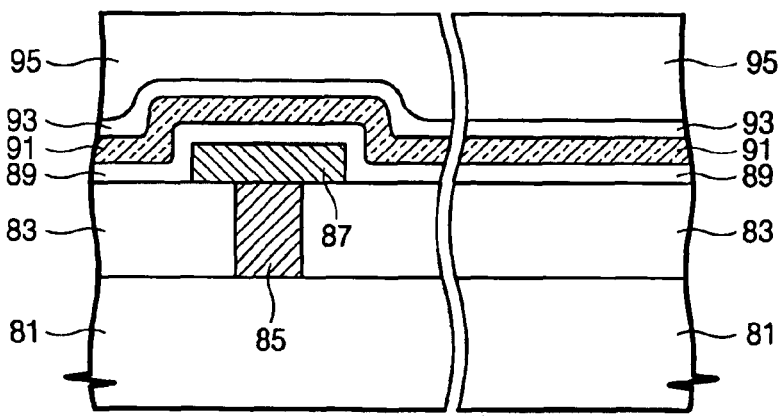

Referring to FIGS. 4 and 7, a capping layer 93 is formed on the top electrode 91 (Block 61). In some embodiments according to the present invention, the capping layer 93 is formed of a tantalum oxide layer (TaO), an aluminum oxide layer (AlO) or a titanium oxide layer (TiO), a tantalum nitride layer (TaN), a titanium nitride layer (TIN) or combinations of these materials. The capping layer 93 may enhance the adhesive strength between the top electrode 91 and an upper interlayer insulating layer formed thereon.

Figure 8:
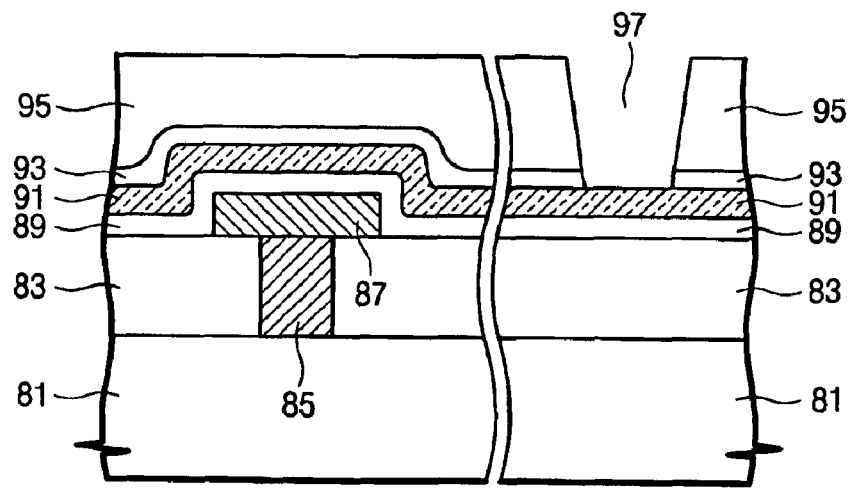
Figure 9:
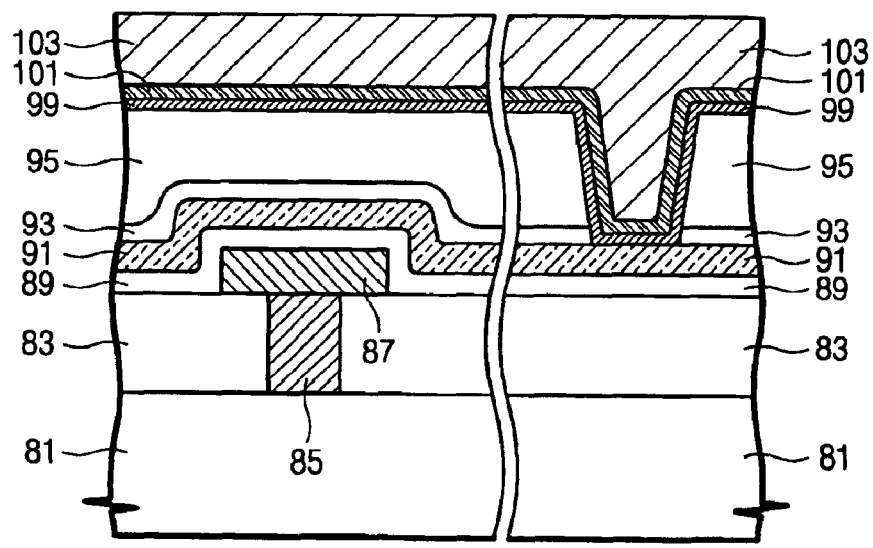

An upper interlayer insulating layer 95 is formed on the capping layer 93 (Block 63). In some embodiments according to the present invention, the upper interlayer insulating layer 95 may be formed of a borophosphosilicate glass (BPSG) layer, an undoped silicate glass (USG) layer or a high plasma density (HDP) oxide layer or a combination of these material. It will be further understood that the noble metal layer can be formed of other materials. Referring to FIGS. 4, 8 and 9, the upper interlayer insulating layer 95 and the capping layer 93 are successively patterned to form a metal contact hole 97 that exposes a predetermined region of the top electrode 91 (Block 65). The exposed top electrode 91 is then reduced (Block 67). In some embodiments according to the present invention, the reducing process is achieved by loading the substrate having the metal contact hole 97 into a furnace, increasing the atmosphere in the furnace to a temperature in a range between about 200 and about 500° C., and introducing hydrogen gas into the furnace for a time in a range between about 10 and about 60 minutes. In other embodiments according to the present invention, the reducing process can be achieved by loading the substrate having the metal contact hole 97 into a chamber, heating the substrate up to a temperature in a range between about 200 and about 700° C., and generating hydrogen plasma inside the chamber for a time in a range between about 5 and about 60 seconds. Accordingly, the amount of the excessive oxygen atoms in the exposed top electrode 91 can be decreased.

A wet cleaning process using hydrofluoric acid solution may be carried out before or after the reducing process (Block 69) as illustrated by the three different branches of FIG. 4 that include Block 67. The wet cleaning process can remove or reduce a native oxide formed on the exposed top electrode 91 as well as a polymer formed in the metal contact hole 97.

Subsequently, a metal layer is formed on the surface of the substrate where the reducing process is performed and in the metal contact hole 97 (Blocks 71 and 73). The metal layer is formed by sequentially stacking an ohmic metal layer 99, a barrier metal layer 101 and an interconnection metal layer 103. In some embodiments according to the present invention, the ohmic metal layer 99 is formed of a titanium layer, and the barrier metal layer 101 is formed of a titanium nitride layer. In some embodiments according to the present invention, the interconnection metal layer 103 is formed of an aluminum layer or an aluminum alloy layer. The interconnection metal layer 103 can reduce or prevent the formation of an insulating material layer, such as a titanium oxide layer, at an interface between the ohmic metal layer 99 and the top electrode 91 because of the reduction of excessive oxygen atoms in the top electrode 91 as described above. The interconnection metal layer 103, the barrier metal layer 101 and the ohmic metal layer 99 are successively patterned to form an interconnection line that covers the metal contact hole 97.

Figure 10:
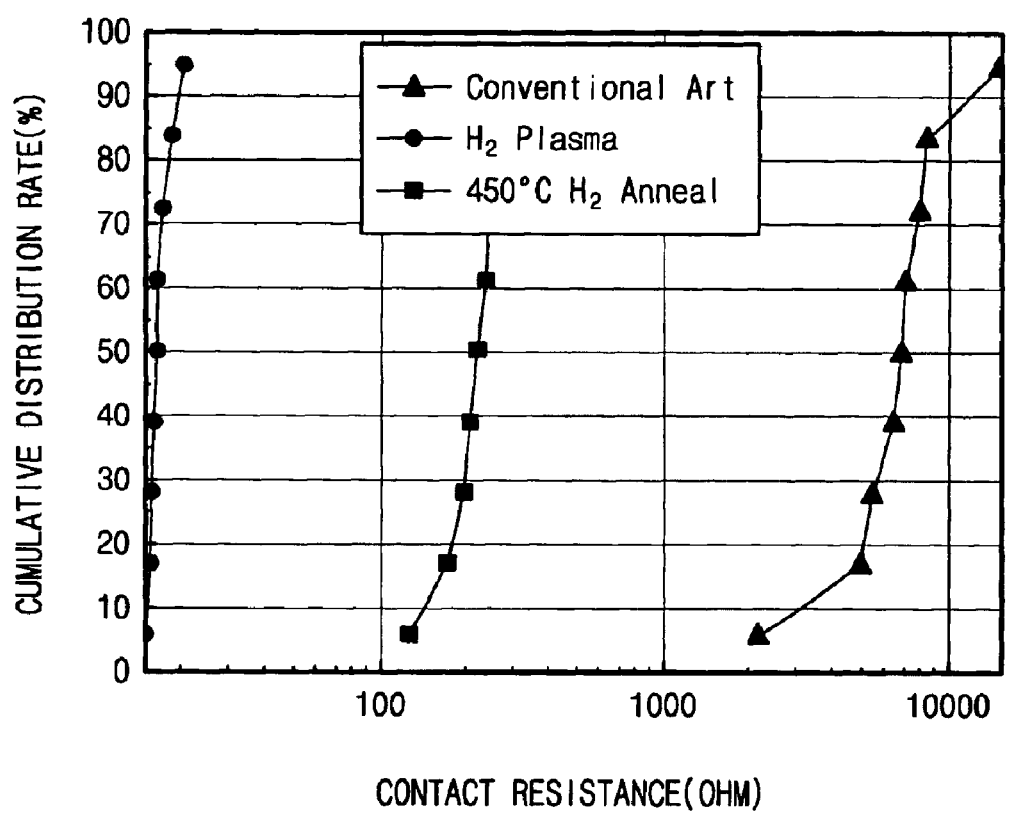
FIG. 10 is a graph showing comparative contact resistances of integrated circuit devices fabricated according to conventional techniques and according to the present invention.

FIG. 10 is a graph comparing electrical characteristics of semiconductor devices fabricated according to the conventional art and exemplary devices fabricated according to the present invention. In the graph of FIG. 10, the abscissa represents the total contact resistance of 1,000 metal contacts, which are serially connected, and the ordinate represents the cumulative distribution rate of the contact resistance. The exemplary conventional devices and the exemplary devices formed according to the present invention were both formed as follows: the top electrode and the capping layer were formed of a ruthenium layer and a tantalum oxide layer respectively, and the ohmic metal layer, the barrier metal layer and the interconnection metal layer were formed of a titanium layer, a titanium nitride layer and an aluminum layer respectively. The size of the respective metal contacts was 0.17×0.17 square microns on the mask used to fabricate the exemplary devices. In the exemplary device embodiments formed according to the present invention, the reducing process using hydrogen gas or hydrogen plasma was performed prior to the wet cleaning process using hydrofluoric acid solution. The reducing process using the hydrogen gas was performed at a temperature of about 450° C. for about 30 minutes, and the reducing process using the hydrogen plasma was performed for about 30 seconds after heating the substrate to a temperature of about 450° C. In contrast, exemplary devices formed according to conventional techniques employed a wet cleaning process using a hydrofluoric acid solution without any reducing process.

As shown in FIG. 10, the metal contact resistance values of the present invention were distributed within a range between about 10 ohms and about 400 ohms, whereas the metal contact resistance values of the conventionally formed exemplary devices were distributed within a range of 2 kilo-ohms to 20 kilo-ohms. For example, the embodiment of the invention using the hydrogen plasma showed uniform and low metal contact resistances within a range between about 10 ohms and about 25 ohms.

In embodiments according to the present invention as described above, after forming the metal contact hole that exposes the top electrode of the capacitor including a high dielectric layer, the exposed top electrode is reduced. Thus, the metal contact resistance can be decreased compared to devices formed using conventional techniques.

What is claimed is:

1. A method of fabricating a semiconductor device comprising:
   forming a capacitor on a substrate, the capacitor including a first electrode, a dielectric layer on the first electrode and a second electrode on the dielectric layer;
   forming an interlayer insulating layer on the substrate;
   forming a metal contact hole in the interlayer insulating layer to expose a region of the second electrode; and
   reducing the exposed region of the second electrode to reduce an amount of oxygen in the second electrode.

2. The method of claim 1, wherein reducing the exposed region of the second electrode comprises reducing the exposed region of the second electrode in a hydrogen gas atmosphere at a temperature in a range between about 200 degrees Centigrade (° C.) and about 500° C.

3. The method of claim 1, wherein reducing the exposed region of the second electrode comprises reducing the exposed region of the second electrode in a hydrogen plasma atmosphere at a temperature in a range between about 200° C. to about 700° C.

4. The method of claim 1, wherein the first electrode is selected from the group consisting of a doped silicon layer, a noble metal layer, and a conductive metal oxide layer.

5. The method of claim 4, wherein the noble metal layer is a platinum layer, a ruthenium layer or an iridium layer.

6. The method of claim 5, wherein the noble metal layer is selected from the group consisting of a platinum layer, a ruthenium layer and an iridium layer.

7. The method of claim 5, wherein the conductive metal oxide layer is selected from the group consisting of a platinum oxide layer (PtO), a ruthenium oxide layer (RuO) and an iridium oxide layer (IrO).

8. The method of claim 4, wherein the conductive metal oxide layer is selected from the group consisting a platinum oxide layer (PtO), a ruthenium oxide layer (RuO), and an iridium oxide layer (IrO).

9. The method of claim 1, wherein the dielectric layer comprises a dielectric layer having a dielectric constant higher than that of the interlayer insulating layer.

10. The method of claim 9, wherein the dielectric layer is selected from the group consisting a tantalum oxide layer (TaO), an aluminum oxide layer (AlO), a titanium oxide layer (TiO), a PLZT layer ((Pb,La)(Zr,Ti)$O_3$), and a BST layer ((Ba,Sr)Ti$O_3$).

11. The method of claim 1, wherein the second electrode is selected from the group consisting a noble metal layer and a conductive metal oxide layer.

12. The method of claim 1 further comprises:
   forming a capping layer on the substrate prior to forming the interlayer insulating layer, wherein the metal contact hole is formed by sequentially patterning the interlayer insulating layer and the capping layer.

13. The method of claim 12, wherein the capping layer is selected from the group consisting of a tantalum oxide layer (TaO), an aluminum oxide layer (AlO), a tantalum nitride layer (TaN), a titanium nitride layer (TIN) and a titanium oxide layer (TiO).

14. The method of claim 1 further comprises:
wet cleaning a surface of the substrate having the metal contact hole before or after reducing the exposed second electrode.

15. The method of claim 14, wherein the wet cleaning process comprises wet cleaning using hydrofluoric acid solution.

16. The method of claim 1 further comprises:
sequentially forming an ohmic metal layer and a barrier metal layer in the metal contact hole after reducing the second electrode.

17. The method of claim 16, wherein the ohmic layer comprises a titanium layer.

18. The method of claim 16, wherein the barrier metal layer comprises a titanium nitride layer.

19. A method of fabricating a semiconductor device comprising:
forming a first electrode on a semiconductor substrate;
forming a high dielectric layer on an entire surface of the substrate having the first electrode;
annealing the high dielectric layer to crystallize the high dielectric layer;
forming a second electrode on the crystallized high dielectric layer;
annealing the substrate having the second electrode in oxygen atmosphere to cure oxygen vacancy defects in the high dielectric layer;
sequentially forming a capping layer and an upper interlayer insulating layer on the second electrode;
successively patterning the upper interlayer insulating layer and the capping layer to form a metal contact hole exposing a predetermined region of the second electrode;
reducing the exposed second electrode to decrease amount of oxygen atoms in the exposed second electrode; and
sequentially forming an ohmic metal layer and a barrier metal layer on an entire surface of the substrate having the reduced second electrode.

20. The method of claim 19, wherein the high dielectric layer is formed of a tantalum oxide layer (TaO), an aluminum oxide layer (AlO), a titanium oxide layer (TiO), a PLZT layer ((Pb,La)(Zr,Ti)O$_3$) or a BST layer ((Ba,Sr)TiO$_3$).

21. The method of claim 19, wherein the second electrode is formed of a ruthenium layer, an iridium layer, a platinum layer, a ruthenium oxide layer, an iridium oxide layer or a platinum oxide layer.

22. The method of claim 19, wherein the capping layer is formed of a tantalum oxide layer, an aluminum oxide layer, a tantalum nitride layer, a titanium nitride layer or a titanium oxide layer.

23. The method of claim 19, wherein reducing the second electrode is performed using hydrogen gas at a temperature of 200 degrees C. to 500 degrees C.

24. The method of claim 19, wherein reducing the second electrode is performed using hydrogen plasma at a temperature of 200 degrees C. to 700 degrees C.

25. The method of claim 19 further comprises wet cleaning a surface of the substrate having the metal contact hole before or after reducing the second electrode.

26. The method of claim 25, wherein the wet cleaning process is performed using hydrofluoric acid solution.

27. The method of claim 19, wherein the ohmic metal layer is formed of a titanium layer.

28. The method of claim 19, wherein the barrier metal layer is formed of a titanium nitride layer.

29. The method of claim 19, further comprising:
forming an aluminum layer on the barrier metal layer; and
patterning the aluminum layer, the barrier metal layer and the ohmic metal layer to form a metal interconnection line that covers the metal contact hole.

* * * * *